(12) United States Patent
Spariosu

(10) Patent No.: US 8,790,440 B2
(45) Date of Patent: Jul. 29, 2014

(54) FORMING SPHERICAL SEMICONDUCTIVE NANOPARTICLES

(75) Inventor: Kalin Spariosu, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 517 days.

(21) Appl. No.: 12/941,409

(22) Filed: Nov. 8, 2010

(65) Prior Publication Data

US 2012/0111148 A1 May 10, 2012

(51) Int. Cl.
*B22F 9/04* (2006.01)
*H01L 21/477* (2006.01)
*B82Y 40/00* (2011.01)
*H01L 21/324* (2006.01)
*B22F 9/12* (2006.01)
*H01L 21/67* (2006.01)

(52) U.S. Cl.
CPC ............. *B82Y 40/00* (2013.01); *H01L 21/3247* (2013.01); *B22F 9/12* (2013.01); *B22F 2998/00* (2013.01); *H01L 21/67109* (2013.01); *Y10S 977/774* (2013.01); *Y10S 977/824* (2013.01); *Y10S 977/90* (2013.01)
USPC ................... 75/338; 75/342; 264/12; 264/15; 977/774; 977/824; 977/900

(58) Field of Classification Search
None
See application file for complete search history.

(56) References Cited

U.S. PATENT DOCUMENTS

| | | | |
|---|---|---|---|
| 5,695,617 A * | 12/1997 | Graiver et al. | 204/157.41 |
| 7,282,167 B2 | 10/2007 | Carpenter | |
| 2004/0065170 A1* | 4/2004 | Wu et al. | 75/10.13 |
| 2004/0086452 A1* | 5/2004 | Seol et al. | 423/598 |
| 2005/0095194 A1* | 5/2005 | Park et al. | 423/622 |

OTHER PUBLICATIONS

Zhou et al., "Anisotropic growth of indium antimonide nanostructures", The European Physical Journal D, vol. 43, 2007, pp. 283-286.
Wise, "Lead Salt Quantum Dots: the Limit of Strong Quantum Confinement", Accounts of Chemical Research, vol. 33, No. 11, 2000, pp. 773-780.
Pietryga et al., "Pushing the Band Gap Envelope: Mid-Infrared Emitting Colloidal PbSe Quantum Dots", Journal American Chemical Society Communications, vol. 126, No. 38, 2004, pp. 11782-11783.

* cited by examiner

*Primary Examiner* — George Wyszomierski
(74) *Attorney, Agent, or Firm* — Renner, Otto, Boisselle & Sklar, LLP

(57) ABSTRACT

In certain embodiments, a material comprising one or more semiconductive substances is vaporized to generate a vapor phase condensate. The vapor phase condensate is allowed to form nanoparticles. The nanoparticles are annealed to yield substantially spherical nanoparticles.

6 Claims, 1 Drawing Sheet

FORMING SPHERICAL SEMICONDUCTIVE NANOPARTICLES

TECHNICAL FIELD

This invention relates generally to the field of particle formation and more specifically to forming spherical semiconductive nanoparticles.

BACKGROUND

A quantum dot is a semiconductor with excitons that are confined in all three spatial dimensions. Quantum dots have properties that are between those of bulk semiconductors and those of discrete molecules. Known methods of forming quantum dots may not be satisfactory in certain situations.

SUMMARY OF THE DISCLOSURE

In accordance with the present invention, disadvantages and problems associated with previous techniques for forming nanoparticles may be reduced or eliminated.

In certain embodiments, a material comprising one or more semiconductive substances is vaporized to generate a vapor phase condensate. The vapor phase condensate is allowed to form nanoparticles. The nanoparticles are annealed to yield substantially spherical nanoparticles.

Certain embodiments of the invention may provide one or more technical advantages. A technical advantage of one embodiment may be that material comprising one or more semiconductive substances may be vaporized to generate a vapor phase condensate that yields nanoparticles. Another technical advantage of one embodiment may be that the nanoparticles formed from the vapor phase condensate may be annealed to yield substantially spherical nanoparticles.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
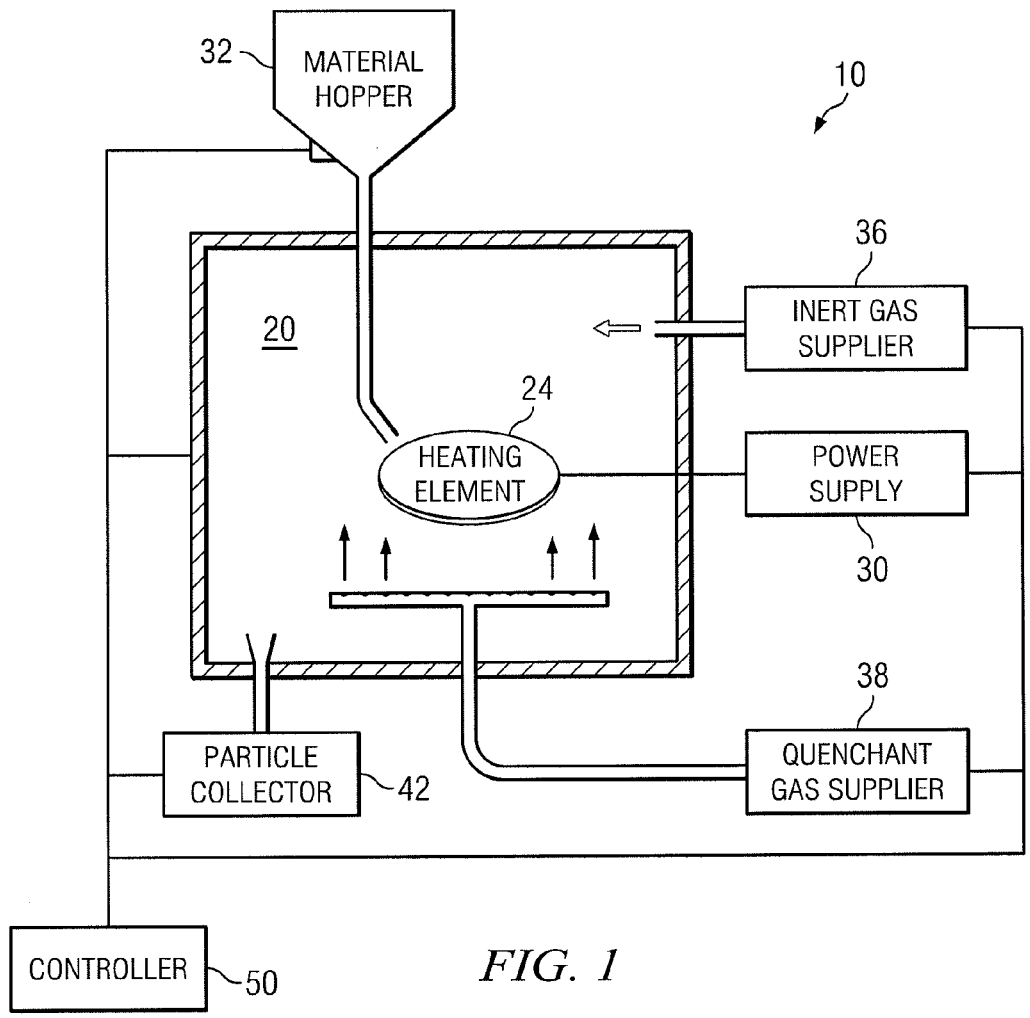
FIG. 1 illustrates an example of a system that may be used to form substantially spherical semiconductive nanoparticles.
Figure 2:
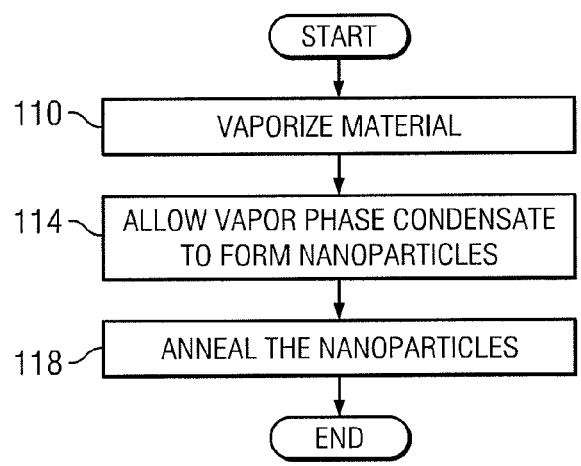
FIG. 2 illustrates an example of a method that may be used to form substantially spherical semiconductive nanoparticles.

Embodiments of the present invention and its advantages are best understood by referring to FIGS. 1 and 2 of the drawings, like numerals being used for like and corresponding parts of the various drawings.

FIG. 1 illustrates an example of a system 10 that may be used to form substantially spherical semiconductive nanoparticles. In certain embodiments, system 10 may vaporize material comprising one or more semiconductive substances to generate a vapor phase condensate that forms nanoparticles. The nanoparticles may be annealed to yield substantially spherical nanoparticles, or "quantum dots".

In certain embodiments, quantum dots are semiconductors with conducting characteristics that are closely related to the size and shape of the crystals of the dots. In general, the smaller the crystal, the larger the band gap, the greater the difference in energy between the highest valance bond and the lowest conduction band becomes, and thus more energy is needed to excite the crystal and more energy is released when the crystal returns to its resting state. The energy spectrum of a quantum dot can be engineered by controlling the size, shape, and strength of the confinement potential.

In the illustrated embodiment, system 10 includes a vacuum chamber 20, a heating element 24, a power supply 30, a material hopper 32, an inert gas supplier 36, a quenchant gas supplier 38, a particle collector 42, and a controller 50, which may be coupled as shown. Examples of certain components and certain operations of system 10 are described U.S. Pat. No. 7,282,167, of Carpenter, which is incorporated herein by reference.

Material hopper 32 provides material that may be used to form nanoparticles, and may direct the material to heating element 24. Any suitable material comprising one or more semiconductive substances may be used. Examples of such material include Indian Antimony (InSb) and mercury cadmium telluride (HgCdTe). The material may be in any suitable form, for example, powder, pellet, sheet, bar, rod, wire, and/or other suitable shape.

The material may also have any suitable proportion of substances and any suitable absorption edge, for example, an absorption edge with a value between 0.5 to 5, 5 to 10, 10 to 15, or greater than 15 microns. Examples of material include a composition of 35 atomic percentage mercury/65 atomic percentage cadmium telluride with an absorption edge of about 1.5 microns; pure cadmium telluride with an absorption edge of 0.8 microns; and a composition of 90 atomic percentage mercury/10 atomic percentage cadmium telluride with an absorption edge of approximately 13 microns.

Vacuum chamber 20 provides an near vacuum volume in which nanoparticles may be formed. Vacuum chamber 20 may have vacuum pumps that control the chamber pressure. In certain embodiments, vacuum chamber 20 may comprise a vessel, or container, which may completely or partially enclose a space. Vacuum chamber 20 may partially enclose a space if gas curtain or other confining means forms a wall of the chamber.

Heating element 24 raises the temperature of the material, causing the material to vaporize and emanate from heating element 24 in a smooth flow away from heating element 24. The heating element can be operated in such a manner that the vaporized material can rise from the element under substantially free convention and/or in a substantially laminar manner. A vaporized material may thermally communicate with a cooling fluid, such as a quenchant gas.

Heating element may be disposed within or adjacent to vacuum chamber 20 and may be stationary or non-stationary. Examples of heating element 24 include a titanium-diboride heater bar, an electrical resistance element heater, and/or hollow tube or slot furnace. Power supply 30 supplies power to heating element 24, and may receive instructions from controller 50 in order to control the temperature of the material.

Inert gas supplier 36 supplies an inert gas, such as argon, to vacuum chamber 20 prior to heating the material. The inert gas may yield an inert atmosphere in chamber 20.

Quenchant gas supplier 38 supplies a quenchant gas to vacuum chamber 20. A quenchant gas may be a gas that is used to cool, or lower the temperature of, a material and may induce a phase change in the material. Examples of quenchant gas include helium, hydrogen, nitrogen, argon, and a combination of any of the preceding. Quenchant gas supplier 38 may comprise one or more diffusers that introduce gas into vacuum chamber 20. In certain embodiments, quenchant gas supplier 38 may direct the flow of cooling fluid generally parallel to and at the same speed as the vaporized material, which may allow the cooling fluid to be in thermal communication with and thermally interact with the flow of vaporized material with reduced turbulence.

Particle collector 42 collects particles from vacuum chamber 20 and may comprise a chamber coupled to vacuum chamber 20. Particle collector 42 may collect particles in any suitable manner. Particle collector 42 may harvest particles from chamber 20 using a continuous flow of a gas, for example, argon, and may be weighed and bottled using the gas.

The particles may have of any suitable size, for example, a size in the nanometer range, such as 30 to 50, 50 to 100, greater than 100 nanometers. In certain embodiments, the particles of a particular batch manufactured at the same time may be substantially spherical and substantially uniformly sized. For example, the sizes of particles of a particle batch may vary with a range of less than 5 nanometers. The particles may be substantially spherical. In certain examples, substantially spherical may refer to spheres that have deviations from a perfect sphere of less than 5%.

In certain embodiments, the particles of a particular batch may have a size of approximately 50 nanometers and an elemental composition by weight of approximately 26% mercury, 27% cadmium, and 47% tellurium.

Controller 50 controls the operation of system 10, and may communicate with components of system 10 (such as vacuum chamber 20, raw material hopper 32, inert gas supplier 36, power supply 30, quenchant gas supplier 38, and/or powder collector 42) to instruct the components to perform operations. Controller 50 may be used to adjust vacuum parameters. Vacuum parameters may include, for example, chamber pressure, temperature, and/or gas flow parameters.

The size of the nanoparticles may be determined by, for example, the heat capacity of the quenchant gas, chamber pressure, the rate of generation of the material vapor, and the flow rate of the quenchant gas.

Quantum dots may be used in any suitable application. In certain embodiments, quantum dots may be used in active and/or passive electro optical (EO) devices such as detectors and lasers. Quantum dots may be fabricated in the visible, near infrared, mid-wavelength infrared (MWIR), long wave infrared (LWIR) spectral ranges.

FIG. 2 illustrates an example of a method that may be used to form substantially spherical semiconductive nanoparticles. The method may be performed by system 10 of FIG. 1.

Material is vaporized at step 110 to generate a vapor phase condensate. In certain embodiments, the material comprises one or more semiconductor substances. The material may be placed on heating element 24. Inert gas supplier 36 may flush vacuum chamber 20 with an inert gas to yield an inert atmosphere. The material may be vaporized by heating the material to a temperature greater than the boiling point of the material. The material may be heated until it is evaporated.

The vapor phase condensate may be allowed to form nanoparticles at step 114. As the vaporized material flows away from heating element 24, individual atoms of the vapor may begin to cool and coalesce into droplets and/or particles. Nano-sized clusters of molecules undergo change of phase from gas to solid. The phase change may occur through reverse sublimation or phase condensation. In certain embodiments, quenchant gas supplier 38 may introduce a quenchant gas into vacuum chamber 20 to cool the vapor.

The nanoparticles are annealed at step 118 to yield substantially spherical nanoparticles. Annealing may involve heating the nanoparticles with heating element 24 to a temperature greater than or equal to a re-crystallization temperature, maintaining the temperature, and then cooling the nanoparticles. For example, annealing may comprise heating the material to a temperature in a range of 200 to 300, 300 to 500, 500 to 700, or greater than 700° C., maintaining the temperature, and then cooling the material to a room temperature in a range of 20 to 30° C.

Modifications, additions, or omissions may be made to the systems and apparatuses disclosed herein without departing from the scope of the invention. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods disclosed herein without departing from the scope of the invention. The method may include more, fewer, or other steps. Additionally, steps may be performed in any suitable order.

A component (such as controller 50) of the systems and apparatuses disclosed herein may include an interface, logic, memory, and/or other suitable element. An interface receives input, sends output, processes the input and/or output, and/or performs other suitable operation. An interface may comprise hardware and/or software.

Logic performs the operations of the component, for example, executes instructions to generate output from input. Logic may include hardware, software, and/or other logic. Logic may be encoded in one or more tangible media and may perform operations when executed by a computer. Certain logic, such as a processor, may manage the operation of a component. Examples of a processor include one or more computers, one or more microprocessors, one or more applications, and/or other logic.

In particular embodiments, the operations of the embodiments may be performed by one or more computer readable media encoded with a computer program, software, computer executable instructions, and/or instructions capable of being executed by a computer. In particular embodiments, the operations of the embodiments may be performed by one or more computer readable media storing, embodied with, and/or encoded with a computer program and/or having a stored and/or an encoded computer program.

A memory stores information. A memory may comprise one or more non-transitory, tangible, computer-readable, and/or computer-executable storage medium. Examples of memory include computer memory (for example, Random Access Memory (RAM) or Read Only Memory (ROM)), mass storage media (for example, a hard disk), removable storage media (for example, a Compact Disk (CD) or a Digital Video Disk (DVD)), database and/or network storage (for example, a server), and/or other computer-readable medium.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

What is claimed is:

1. A method of making spherical quantum dots, the method comprising:
   feeding a material onto a heater element to vaporize the material, the material comprising one or more semiconductive substances;
   allowing the vaporized material to flow upwardly from the heater element under free convection;
   injecting a flow of quenchant gas upwardly from a position below the heater element, parallel to and into contact with the upward flow of the vaporized material and at the same speed as the vaporized material;
   allowing the quenchant gas and vaporized material to thermally interact to allow the material to condense out of the vapor to form a plurality of nanoparticles; and
   annealing the nanoparticles to yield a plurality of substantially spherical quantum dots.

2. The method of claim 1, the one or more semiconductor substances selected from the group consisting of mercury telluride, cadmium telluride, indium, and gallium.

3. The method of claim 1, the material having an absorption edge greater than 0.5 microns.

4. The method of claim 1, further comprising:
   flushing a vacuum chamber in which the material is located with an inert gas to yield an inert atmosphere prior to vaporizing the material.

5. The method of claim 1, the annealing the nanoparticles further comprising:
   heating the nanoparticles to a temperature greater than 200° C.; and
   cooling the nanoparticles to a room temperature.

6. The method of claim 1, further comprising:
   collecting the substantially spherical quantum dots.

* * * * *